United States Patent
Eichenseer et al.

(10) Patent No.: US 7,155,694 B2
(45) Date of Patent: Dec. 26, 2006

(54) TRIAL PLACEMENT SYSTEM WITH CLONING

(75) Inventors: Patrick J. Eichenseer, Austin, TX (US); Hsi-Chuan Chen, Fremont, CA (US); Dennis Huang, Palo Alto, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 217 days.

(21) Appl. No.: 10/897,543

(22) Filed: Jul. 23, 2004

(65) Prior Publication Data

US 2006/0031803 A1    Feb. 9, 2006

(51) Int. Cl.
*G06F 17/50* (2006.01)

(52) U.S. Cl. ............................. 716/10; 716/9; 716/13; 716/14; 716/7

(58) Field of Classification Search ................ 716/9, 716/10, 13, 14, 7
See application file for complete search history.

(56) References Cited

U.S. PATENT DOCUMENTS

| | | | | |
|---|---|---|---|---|
| 5,696,693 A * | 12/1997 | Aubel et al. | | 716/8 |
| 6,412,100 B1 * | 6/2002 | Sasagawa et al. | | 716/9 |
| 6,584,605 B1 * | 6/2003 | Zahar | | 716/10 |
| 6,711,729 B1 * | 3/2004 | McElvain et al. | | 716/18 |
| 6,754,879 B1 * | 6/2004 | Alferness et al. | | 716/8 |
| 6,938,232 B1 * | 8/2005 | Saito et al. | | 716/8 |
| 6,973,632 B1 * | 12/2005 | Brahme et al. | | 716/6 |
| 7,010,769 B1 * | 3/2006 | McElvain et al. | | 716/9 |
| 7,111,266 B1 * | 9/2006 | Correale et al. | | 716/10 |
| 2003/0084416 A1 * | 5/2003 | Dai et al. | | 716/7 |
| 2003/0237069 A1 * | 12/2003 | Mohan et al. | | 716/8 |
| 2004/0025132 A1 * | 2/2004 | Valine | | 716/11 |
| 2004/0243964 A1 * | 12/2004 | McElvain et al. | | 716/12 |
| 2005/0028122 A1 * | 2/2005 | Fallon et al. | | 716/10 |
| 2006/0095879 A1 * | 5/2006 | Brahme et al. | | 716/6 |

* cited by examiner

*Primary Examiner*—Phallaka Kik
(74) *Attorney, Agent, or Firm*—Rosenberg, Klein & Lee (57) ABSTRACT

In accordance with a method for generating a trial placement plan for an IC having two or more identical modules, a floor plan reserves a separate area of identical size and shape for each of the identical modules, one of which is designated a "master module" and the others designated "clone modules". A placement and routing (P&R) tool initially places all of the cell instances of the clone modules at the center of their reserved areas. The P&R tool then employs a conventional placement algorithm to iteratively adjust positions of cell instances of all other modules, including the master module within their reserved areas in a manner that tries to minimize net lengths. The P&R tool copies the placement within the master module area into the clone module areas either after every N>0 iterations of the placement algorithm and/or after the placement algorithm has completed placement for the master module area.

20 Claims, 4 Drawing Sheets

TRIAL PLACEMENT SYSTEM WITH CLONING

BACKGROUND OF THE INVENTION

1. Field of the Invention

The invention relates in general to systems for generating integrated circuit (IC) layouts and in particular to a system for generating a layout for an IC having two or more identical modules.

2. Description of Related Art

An IC fabricator typically provides an IC designer with a cell library describing a set of standard components (cells) such as transistors, gates, input/output ports and other devices that an IC designer can incorporate into an IC design. The IC designer then produces an IC design in the form of a netlist referencing instances of library cells to be included in the IC and referencing the conductive paths (nets) that are to interconnect terminals of the cell instances. The netlist can be hierarchical in nature with cell instances combining to form modules and with lower level modules and cell instances combining to form higher-level modules. After producing the netlist, the designer employs a placement and routing (P&R) tool to generate a layout for the IC indicating where each cell instance is to be placed within the IC and indicating how the nets interconnecting the cell instances are to be routed. The P&R tool also obtains the internal layout of each cell from the cell library and incorporates it into the IC layout.

The placement and routing process can be time-consuming for large ICs because a P&R tool will often have to iteratively generate many layout alternatives before finding one satisfying all spatial, timing and other constraints on the IC design. Since the time required to generate a layout tends to increase geometrically with the number of cell instances included the IC, designers often find that it can be helpful to divide a netlist design into several partitions and to separately lay out each partition. Such partitioning can speed up the placement and routing process because a P&R tool can often more quickly lay out N partitions of a design having an average of M cell instances each than to lay out an entire N×M cell IC at once.

A netlist may describe an IC as including several logically identical modules, each formed by similar sets of cell instances interconnected in a similar manner. For example, a netlist might describe an IC having a set of identical arithmetic logic units (ALUs) forming a data processing array. Since identical modules could have identical layouts, it is possible to reduce the time a P&R tool requires to generate an IC layout by having it generate a layout for only one of the modules (the "master" module) and then copying the layout for that module to produce a layout for each similar ("clone") module.

Figure 1:
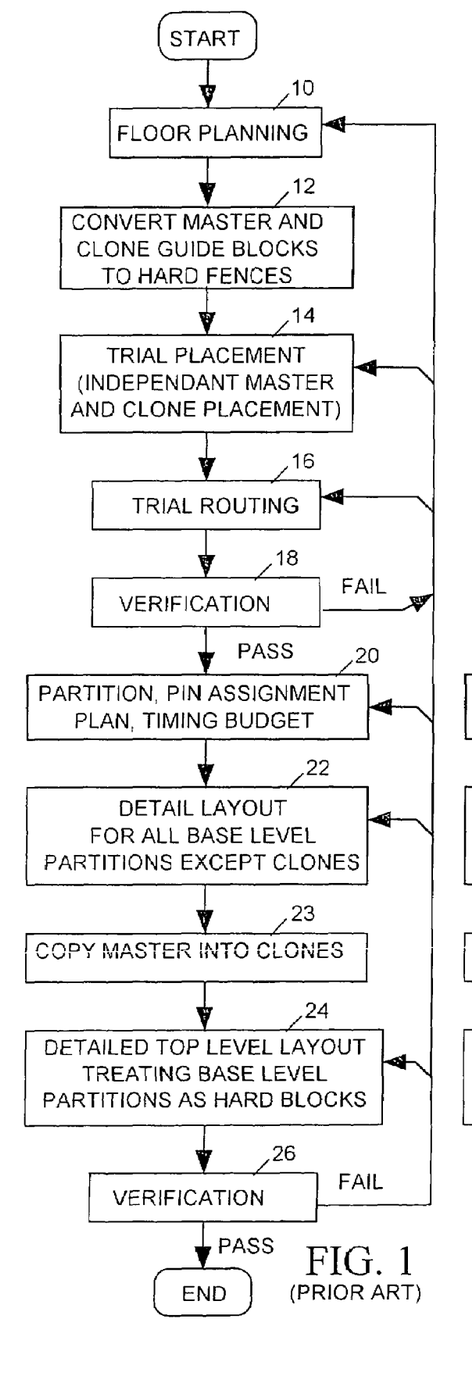
FIG. 1 is a process flow diagram depicting a prior art method for generating an integrated circuit (IC) layout.

FIG. 1 depicts a typical IC layout process flow for an IC having several identical modules. At step 10, an IC designer uses floor-planning tools to create a floor plan for the IC identifying the shape and positions of various areas of the layout. A typical floor plan can identify any of the following four types of areas within an IC layout:

- A "hard block" area is an area of the layout to receive a circuit, such as for example a memory, for which a layout already exists. A P&R tool copies the pre-existing layout of the circuit into the hard block area and does not place any other cell instances in that area.
- A "hard fence" area is an area of the layout exclusively reserved for cell instances forming one or more particular modules of the IC design. A P&R tool must place all cell instances belonging to modules assigned to a hard fence area in that hard fence area and must not place cell instances belonging to other modules of the IC in that hard fence area.
- A "region" is an area of a layout in which one or more modules assigned to the region are to be placed. A P&R tool must place all cell instances of modules assigned to a region within that region, but may also place cell instances of other modules in that region.
- A "guide block" is an area of a layout that acts as a guide for placing a module assigned to the guide block in the P&R tool is biased towards placing cell instances of that module within or near the guide block. However, the P&R tool is not required to place all cell instances of the module within the guide block, and may place cell instances of other modules in the guide block.

Floor planning tools can automatically generate floor plans having guide blocks for selected modules, and the floor plan provided at step 10 includes a separate guide block for the master and each clone.

At step 12, the design engineer alters the floor plan to redefine the guide blocks for the master and the clones as hard fence areas so that the P&R tool will place the master and each clone by itself in an identifiable area of the layout. The design engineer will also redefine as hard fence areas guide blocks for any other modules that are to be separate partitions of the design. A P&R tool then generates a trial placement plan for the entire IC in accordance with the floor plan (step 14). Note that since the P&R tool independently lays out the master and each clone within their respective hard fence areas, they will not all have the same placement. Thereafter the P&R tool generates a trial routing plan describing the approximate routes of the nets interconnecting cell instances (step 16). The design engineer then uses various tools to verify that the logic implemented by the layout matches the logic described by the netlist and to verify that the layout meets various timing and spatial constraints (step 18). If the layout fails to meet its constraints, the process returns to one of steps 10, 14 or 16 to modify the floor plan, the trial placement or the trial routing. The process continues to iterate through steps 10–18 until it arrives at a trial layout passing all verification tests.

At this point (step 20), the designer partitions the netlist into several smaller netlists, including a set of base level partitions and a top-level partition. Each base level partition corresponds to a separate hard fence area of the floor plan and describes the module(s) assigned to that hard fence area. The top-level partition includes all portions of the design not included in any base level partition. The master and each of the clones and various other modules are also treated as separate partitions. As part of the partitioning process, the design engineer develops a pin assignment plan for each partition indicating points at which nets are to cross boundaries of each partition based on the trial routing plan provided at step 16. Since the IC specification typically places timing constraints on various signal paths within the IC that may extend through more than one partition, the design engineer also develops a timing budget at step 22 allocating separate portions of the timing constraint on each signal path to each of the various partitions through which the signal path may extend.

The design engineer then (step 22) employs a P&R tool to separately lay out the master partition and any other partition other than the clone partitions. After generating the clone layouts by copying the master layout (step 23), the P&R tool generates a layout for the top level partition based on a modified original floor plan (step 24) wherein the base level partitions are designated as hard blocks having the detailed layouts established at steps 22 and 23.

After generating the detailed top-level layout, the design engineer may use various tools to verify that the detailed layout meets all constraints (step 26). If the detailed layout fails to meet its constraints, the process will revert to any of steps 20, 22 or 24 to modify the pin assignment plan or timing budget, to modify the layout of one or more of the partitions, or to modify the top level layout in an attempt to meet all verification tests. In some cases, it may be necessary to revert all the way back to step 10 to modify the original floor plan. The layout process ends following step 26 when the detailed layout passes all verification tests. Note that copying the master module layout into the clone module layouts at step 23 helps to shorten the time needed to generate the detailed layout.

We can think of the trial layout generated at steps 12–16 as a prediction of what the detailed layout generated at steps 20–24 will look like. If the trial layout is a good predictor of the detailed layout, then trial layout verification carried out at step 18 will be a good predictor of the outcome of the detailed layout verification carried out at step 26. Since iterations through the detailed layout process (steps 22–26) consume more time than iterations through the trial layout process (steps 12–16), we want to the extent possible to use iterations though the trial layout process rather than iterations through the detailed layout process to resolve layout problems. Thus, it is important for the trial layout to be a good predictor of what the detailed layout will look like, without being too time-consuming to produce.

One difficulty with the prior art layout process of FIG. 1 is that in the trial layout, the master and clone modules are independently placed and routed at steps 14 and 16, and the time required to generate independent layouts for the clones unnecessarily adds to the time required to generate the trial layout. Note also that in the trial layout the clone layouts do not match the master module layout, whereas in the detailed layout the clone layouts are copies of the master layout. Thus, the trial layout is not always a good predictor of the detailed layout with respect to the clone modules.

SUMMARY OF INVENTION

The invention relates to an integrated circuit (IC) layout process of the type including steps of:

generating a floor plan reserving areas of the IC for particular modules, generating a trial placement plan placing cell instances forming each module in their reserved areas, generating a trial routing plan defining approximate routes of nets interconnecting cell instances, verifying that the trial placement and routing plans meet design constraints, partitioning the IC design, including establishing a pin assignment plan and timing budget for each reserved area, so that placement and routing tools can independently generate a detailed layout for each area, generating detailed placement and routing plans for each partition, and generating placement and routing plans for the entire IC incorporating the detailed placement and routing plans of each partition, and verifying that the detailed IC placement and routing plans meet design constraints.

The invention relates in particular to a method for generating the trial placement plan for an IC having two or more identical modules. In accordance with the invention, the floor plan reserves a separate area of identical size and shape for each of the identical modules, one of which is designated a "master module" and the others designated "clone modules". A placement and routing (P&R) tool initially places all of the cell instances of the clone modules at the center of their reserved areas. The P&R tool then employs a conventional placement algorithm to iteratively adjust positions of cell instances of all other modules, including the master module within their reserved areas in a manner that tries to minimize net lengths. In one embodiment of the invention, the P&R tool copies the placement within the master module area into the clone module areas only after the placement algorithm has completed the placement plan for the master module area. In accordance with another embodiment of the invention, the P&R tool periodically modifies the clone module area placements after every N>0 iterations of the placement algorithm to make them copies the current state of the master module area placement.

In either case, at the end of the trial placement process, the master and clone modules areas will all have identical placements. The trial routing plan will then reflect the fact that the master and clone areas have identical placements. Later, during the detailed layout phase, the P&R tool generates a detailed layout only for the master module and creates a detailed layout for the clone modules simply by copying the master module's detailed layout.

Since the clone module trial layouts are also copies of the master module trial layout, the trial layout verification step makes a better predictor of the outcome of the detailed layout verification step than if the master and clone module trial layouts were to differ.

The claims appended to this specification particularly point out and distinctly claim the subject matter of the invention. However those skilled in the art will best understand both the organization and method of operation of what the applicant(s) consider to be the best mode(s) of practicing the invention by reading the remaining portions of the specification in view of the accompanying drawing(s) wherein like reference characters refer to like elements.

DETAILED DESCRIPTION OF THE INVENTION

The present invention relates to software that can be stored on computer-readable media, then read, and executed by a conventional computer. Suitable computer-readable media for storing the software include, but are not limited to, compact disks, floppy disks, hard disks, and random access or read only memory. While the specification describes in detail at least one exemplary embodiment of the invention considered a best mode of practicing the invention, those of skill in the art will appreciate that the invention is not limited to the particular example(s) described below or to the manner in which they operate.

An integrated circuit (IC) designer typically produces a netlist describing an IC as being formed by a set of conductive paths ("nets") interconnecting instances of standard IC components (cells) described in a cell library. A netlist will often describe the IC hierarchically with cell instances being organized into a hierarchy of modules, where each module has some identifiable function. The designer then employs a placement and routing (P&R) tool to generate a layout for the IC indicating where each cell instance is to be placed within the IC and indicating how the nets interconnecting the cell instances are to be routed.

In an IC layout method in accordance with the invention, when a netlist design describes an IC as having two or more identical modules, the netlist design is partitioned so that each of the identical modules is treated as a separate partition. A P&R tool then independently generates a trial layout and a detailed layout for only one of the modules (the "master module") and copies the trial and detailed layouts for the master module to provide trial and detailed layouts for each similar ("clone") module.

Figure 2:
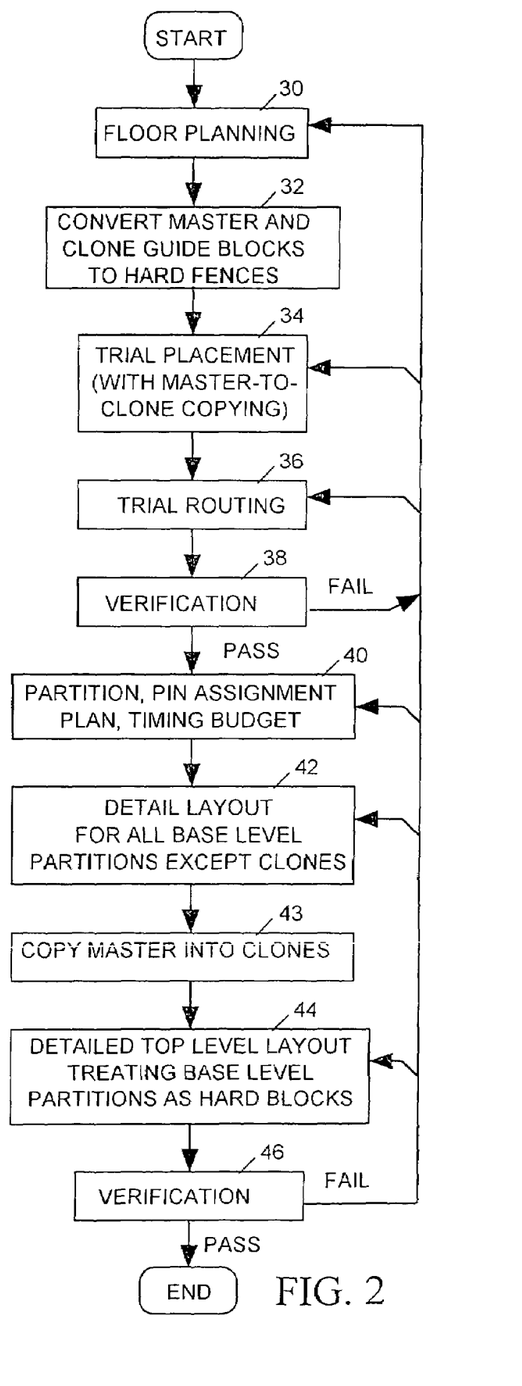
FIG. 2 is a process flow diagram depicting a method in accordance with the invention for generating an integrated circuit (IC) layout.

FIG. 2 is a process flow diagram illustrating an IC layout system in accordance with the invention suitable for implementation by conventional computer executing software stored on computer-readable media. At step 30, an IC designer initially uses floor-planning tools to create a floor plan for the IC identifying the shape and positions of various areas of the layout. A typical floor plan can identify any of the following four types of areas within an IC layout:

A "hard block" area is an area of the layout to receive a circuit, such as for example a memory, for which an internal layout already exists. A P&R tool copies the pre-existing layout of the circuit into the hard block area and does not place any other cell instances in that area.

A "hard fence" area is an area of the layout exclusively reserved for cell instances forming one or more particular modules of the IC design. A P&R tool must place all cell instances belonging to modules assigned to a hard fence area in that hard fence area and must not place cell instances belonging to other modules of the IC in that hard fence area.

A "region" is an area of a layout in which one or more particular modules are to be placed. A P&R tool must place all cell instances of those particular modules within that region, but may also place cell instances of other modules within that region.

A "guide block" is an area of a layout that acts as a guide for placing a module assigned to the guide block. The P&R tool is biased towards placing cell instances of that module within or near the guide block, but is not required to place all cell instances of the module within the guide block, and may place cell instances of other modules in the guide block.

Floor planning tools can automatically generate floor plans having guide blocks for selected modules, and the floor plan provided at step 30 includes a separate guide block for the master and each clone, and may include guide blocks, regions, hard fences and hard blocks for other modules as well.

At step 32, the design engineer alters the floor plan to redefine the guide blocks for the master and the clones as hard fence areas so that the P&R tool will place the master and each clone by itself in an identifiable area of the layout. The design engineer will also redefine as hard fence areas guide blocks for any other modules that are to be separate partitions of the design. A P&R tool then generates a trial placement plan for the entire IC in accordance with the modified floor plan (step 34). However in generating the trial placement, a P&R tool in accordance with the invention independently lays out only the master; it copies the master placement to produce the clone placements, thereby saving time by refraining from independently generating the clone placement.

Thereafter (step 36), the P&R tool generates a trial routing plan describing the approximate routes of the nets interconnecting cell instances. The design engineer then uses various tools to verify that the logic implemented by the layout matches the logic described by the netlist and to verify that the layout meets various timing and spatial constraints (step 38). If the layout fails to meet its constraints, the process returns to one of steps 30, 34 or 36 to modify the floor plan, the trial placement or the trial routing. The process continues to iterate through steps 10–18 until it arrives at a trial layout passing all verification tests.

At this point (step 40), the designer partitions the netlist into several smaller netlists, including a set of base level partitions and a top-level partition. Each base level partition, including the master and each clone partition, corresponds to a separate hard fence area of the floor plan and describes the module(s) assigned to that hard fence area. The top-level partition includes all portions of the design not included in any base level partition. As part of the partitioning process, the design engineer develops a pin assignment plan for each partition indicating points at which nets are to cross boundaries of each partition based on the trial routing plan provided at step 36. Many of the signal paths within an IC will be subject to timing constraints, so in addition to creating a floor plan and a pin assignment plan at step 40 (FIG. 2), it is also necessary to create a timing budget allocating portions of the timing constraint on each signal path to each partition in which the signal path resides.

The design engineer then (step 42) employs a P&R tool to separately generate a detailed layout out for the master partition and any other partition other than the clone partitions. After generating the clone layouts by copying the master layout (step 43), the P&R tool generates a detailed layout for the top level partition based on a modified original floor plan (step 44) wherein the base level partitions are designated as hard blocks having the detailed layouts established at steps 42 and 43.

After generating the detailed top-level layout, the design engineer may use various tools to verify that the detailed layout meets all constraints (step 46). If the detailed layout fails to meet its constraints, the process will revert to any of steps 40, 42 or 44 to modify the pin assignment plan or timing budget, to modify the layout of one or more of the partitions, or to modify the top level layout in an attempt to meet all verification tests. In some cases, it may be necessary to revert all the way back to step 30 to modify the original floor plan. The layout process ends following step 46 when the detailed layout passes all verification tests. Note that copying the master module layout into the clone module layouts at step 43 helps to shorten the time needed to generate the detailed layout.

The trial placement and routing plans generated at steps 34 and 36 predict what the detailed layout generated at steps 42–44 will look like. If the trial layout is a good predictor of the detailed layout, then the outcome of the trial layout verification step 38 will be a good predictor of the outcome of the detailed layout verification step 46. Since iterations through the detailed layout process (steps 42–46) consume substantially more time than iterations through the trail layout process (steps 32–38), it is preferable to identify and resolve layout problems at the trial layout stage of the process rather the detailed layout stage. Thus, it is important for the trial layout to be a good predictor of whether the detailed layout will meet all constraints placed on it, without being too time-consuming to produce. The present invention represents an improvement over prior art methods because it reduces the time required to perform trial placement by eliminating the need to independently place the clones, since the clones are placed simply by copying the master. More importantly, by copying the master placement to generate the clone placements at the trial layout stage rather than only at the detailed layout stage, a method in accordance with the invention renders the trial layout a better predictor of the detailed layout.

Figure 3:
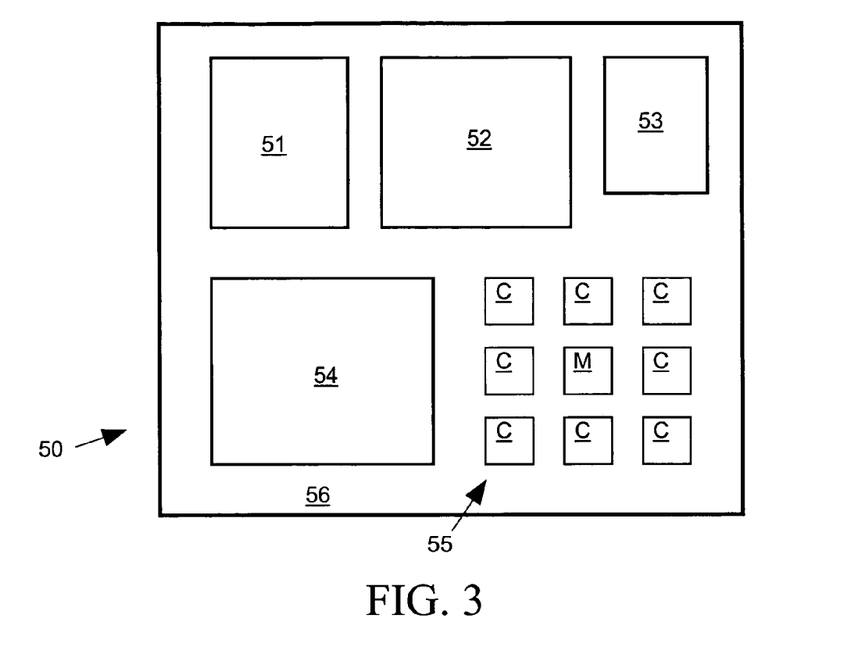
FIG. 3 is a simplified plan view of a floor plan for an integrated circuit layout.

FIG. 3 illustrates an example floor plan 50 for an IC including various base level areas 51–54, an array of areas 55 including an area M for placing a master module, and a set of areas C for clones of the master module. Floor plan 50 also includes a top level area 56 including all modules and cell instances not included in any of the base level areas and for providing space for routing nets between the base level areas. At the trial layout stage, a P&R tool lays out the entire IC in a single placement and routing process, but at the detailed layout stage, the base level areas 51–54 and M are separately and independently placed, and placements for areas C are generated as copies of the placement for area M. The top-level area 56 is then laid out with areas 51–56 treated as hard block areas having predetermined layouts.

A P&R tool tries to minimize net lengths when placing cell instances. Therefore when attempting to optimize placement of cell instances within any one hard fence area at the trial layout stage (step 34, FIG. 2), the P&R tool needs to know the positions of cell instances residing outside that hard fence area linked by nets to cell instances within the area. When a net interconnects two cells, a P&R tool tries to put them as close together as possible so that the net or nets interconnecting them will be as short as possible to improve the likelihood that the net will meet timing constraints. Often when an IC design includes a set of identical modules, cell instances forming those modules form a highly interconnected data processing array. Thus, not only is it usually desirable to place the master and clone hard fence areas near one another as seen in FIG. 3, it is also desirable to a place cell instances that communicate across area boundaries as near as possible to those boundaries to minimize the net lengths.

Therefore, when a P&R tool attempts to optimize a cell instance placement within a master module's hard fence area M, it must make a reasonable estimate as to cell instance placement within the clone hard fence areas C, particular if the master and clone modules are highly interconnected. That is why a prior art P&R tool concurrently places the master and clone hard fence areas 55 at the trial layout stage. A prior art P&R tool can generate a detailed layout for the master module partition without considering the placement of cell instances in the clone modules partitions or in any other partition because at that point it has the benefit of a pin assignment plan telling it where nets are to cross the master module area boundaries. However, the pin assignment plan is based on the trial layout in which the clone module placement may differ substantially from the master module placement. Thus, the pin assignment plan may not be optimal for a detailed layout in which the clone partition placements are to be identical copies of the master module placement.

Figure 4:
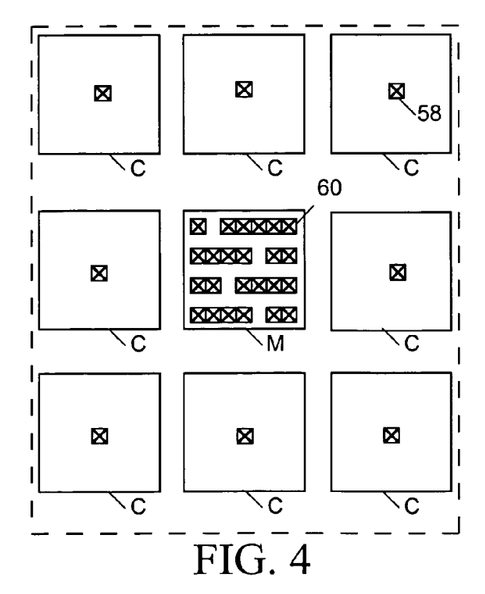
FIGS. 4 and 5 are plan views of the master module area and its eight neighboring clone module areas of FIG. 3 before and after copying the master module area placement to produce clone module area placements.
Figure 5:
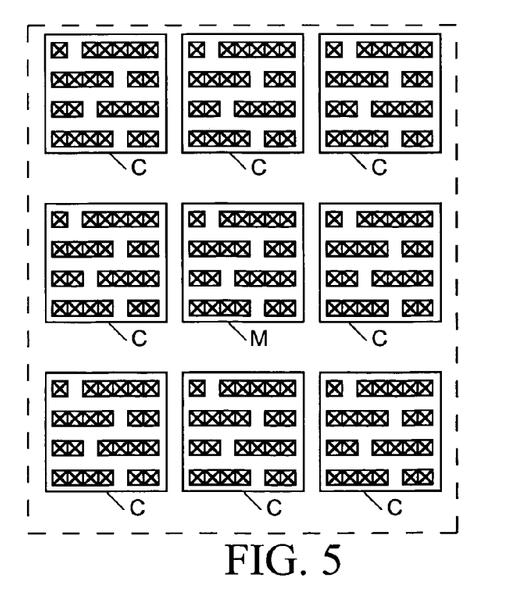

A P&R tool in accordance with the invention can use either of two approaches to resolve the problem of making the clone module layouts copies of the master module placement at the trial placement stage (step 34, FIG. 2). FIGS. 4 and 5 illustrate one approach. During the trial placement step 34, the P&R tool initially assumes that all cell instances 58 of each clone module are superimposed on one another at the center of the clone module's corresponding area C as illustrated in FIG. 4. Then, for example, using a conventional "min-cut" placement algorithm to generate the placement plan for master module area M, the P&R tool places cell instances 60 within the master module area M in a way that is biased towards minimizing lengths of nets between cell instances 60 and cell instances in areas C and other areas of the trial layout. After generating the placement plan for the master module M, the P&R tool then copies the master module placement plan to produce the clone layout plans, as illustrated in FIG. 5, before moving on to the trial routing stage (step 36, FIG. 2). This approach is quicker than the prior art approach of independently placing the clone modules at step 14 (FIG. 1) because the P&R tool avoids having to independently generate placement plans for each of the clone module areas C. Since the clone module area placements in the trial placement plan are identical to the master module placement, the trial routing plan generated at step 36 is likely to be a better predictor of the nature of the detailed routing plan than the trial routing plan generated at prior art method step 16 (FIG. 1).

Figure 6:
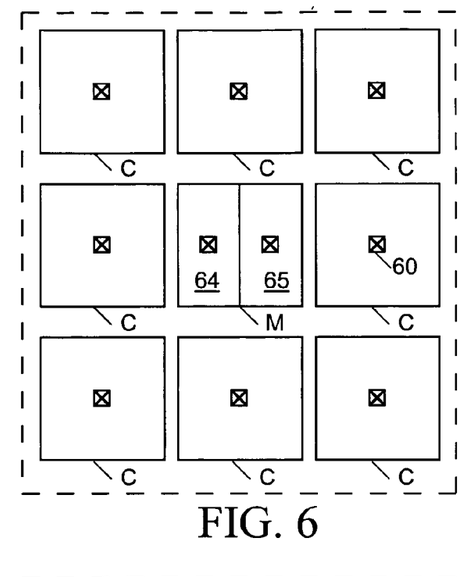
FIGS. 6–11 are plan views of master and clone module area placements at various stages of cell placement during execution of a min-cut placement algorithm in accordance with the invention.

Another approach a P&R tool in accordance with the invention can use to generate clone module area placements during trial placement (step 34) is to periodically copy the master module placement into the clone module placements as the master module area placement evolves during the min-cut placement process. This enables the evolution of the master module placement to take into account the effects of a similar evolution of the clone module placements. For example, FIGS. 6–11 illustrate successive stages of a method in accordance with the invention a P&R tool may use for generating a trial placement plan for the master module M and the clone module areas C of FIG. 3. At the start of the min-cut placement process, the P&R tool initially superimposes all cell instances 60 of each clone module area C at the center of the area as shown in FIG. 6. However, the P&R tool allocates the cell instances of the master module area M between two equally sized sub-areas 64 and 65 of the master module area. The P&R tool allocates approximately the same number of cell instances to each sub-area 64 and 65 in a way that is biased toward minimizing the number of nets that must cross the boundaries of the sub-areas. Thus, the P&R tool will more likely allocate cell instances to sub area 64 linked to cell instances in clone areas to the west of the center of master module area M and will be more likely to allocate cell instances to sub area 65 linked to cell instances in clone areas to the east of the center of master module area M.

Figure 7:
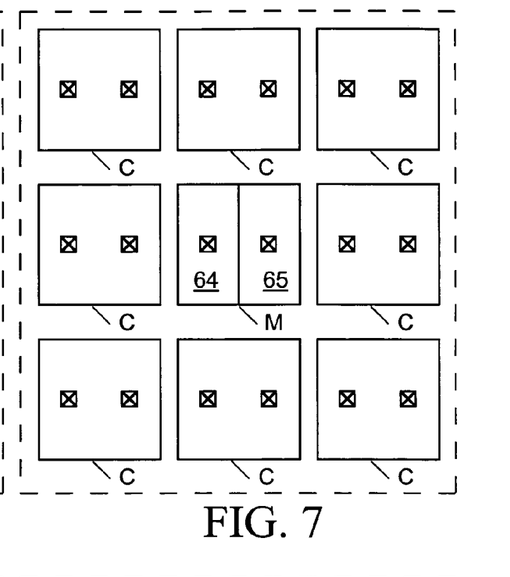
Figure 8:
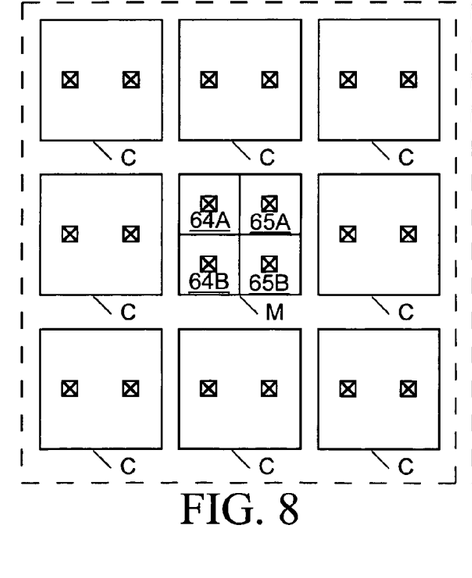
Figure 9:
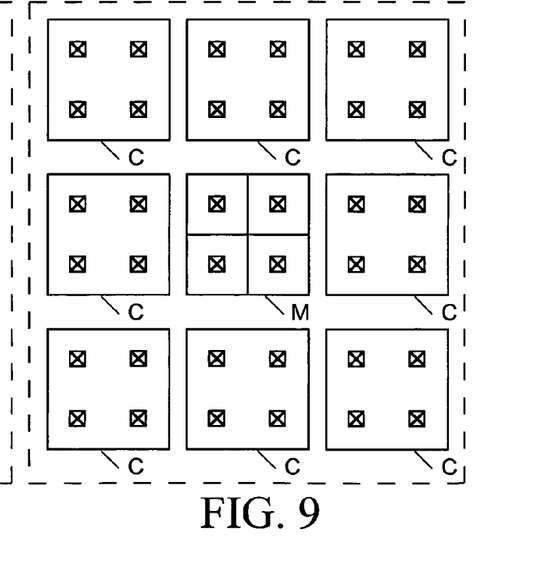

After optimizing the allocation of cell instances to sub-areas 64 and 65, the P&R tool copies the current cell placement of master module area M into the clone areas C as illustrated in FIG. 7. Thus, the cell instances within the clone module areas C are now positioned at two points within each area rather than one. As shown in FIG. 8, the P&R tool then divides sub-area 64 into two smaller sub-areas 64A and 64B and evenly allocates the cells of sub-area 64 between its sub-areas 64A and 64B in a way that minimizes the number of next crossing the boundary of each sub-area 64A and 64B. The P&R tool also allocates cells of sub-area 65 between its smaller sub-areas 65A and 65B in a similar manner. Thus, the P&R tool will more likely allocate cell instances to sub-areas 64A and 65B that are linked to cell instances in clone areas to the north of the center of master module area M and to allocate cell instances to sub-area 64B that are linked to cell instances in clone areas to the south of the center of master module area. The P&R tool then copies the current master module area placement to produce clone module area placements as illustrated in FIG. 9.

Figure 10:
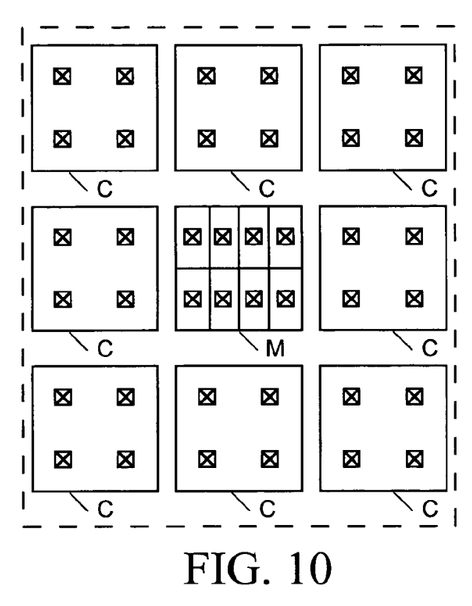
Figure 11:
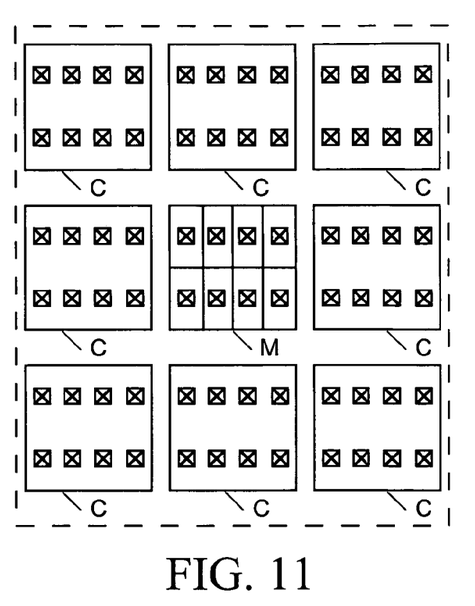

During a next min-cut iteration, as illustrated in FIG. 10, the P&R tool divides each sub-area of the master module area into two smaller sub-areas and relocates its cells among its smaller areas in the manner described above, and then copies the master module area placement to update the clone module area placements as illustrated in FIG. 11. The process continues, for example, until the master module sub-areas are small enough that then can contain only one cell instance.

Although the approach to master and clone module trial placement is described above copies the master module placement into the clone module placement after each min-cut iteration, to save time, such copying can be done, for example, only after each Nth iteration where N>1. The larger the value of N, the less predictive the master module trial placement will be of the detailed placement, but the variation in master module trial placement for small values of N>1 is typically not substantial.

Trial level placement and routing process is somewhat faster using the approach illustrated in FIGS. 4 and 5 than the approach illustrated in FIGS. 6–11 because the master area placement is copied into each clone area only once at the end of the trial placement process rather than several times during the trial placement process. The method of FIGS. 4 and 5 is particularly suitable when the master and clone module partitions are not highly interconnected since positions of cell instances within the clone module areas C have a less substantial effect on the paths of nets linked to cell instances within the master module area M. However, when cell instances within the master and clone module areas are highly interconnected by nets crossing module boundaries, the approach illustrated in FIG. 6–11 is preferable. The trial placement it produces for the master and clone areas will be a better predictor of the detailed placement is later produces at step 44, and the trial routing plan it produces at step 36 of FIG. 2 will be a better predictor of the detailed routing the P&R tool will later produce at step 44. The approach illustrated in FIGS. 6–11 is therefore likely to result in the need for fewer time-consuming iterations through the detailed layout process (steps 40–46) to develop a successful detailed layout meeting all constraints.

The foregoing specification and the drawings depict exemplary embodiments of the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

The invention claimed is:

1. A method for generating a layout for an integrated circuit (IC) based on an IC design describing the IC as comprising cell instances forming a plurality of modules, including a master module and at least one clone module identical to the master module, the cell instances being linked to one another by nets, the method comprising the steps of:
   a. generating a floor plan for the IC, defining positions and dimensions of a plurality of separate areas of the IC, each area corresponding to a separate module of the IC, including a master module area corresponding to the master module, and a separate clone module area corresponding to each clone module, the master module area and each clone module area being identical in size and shape;
   b. generating a trial placement plan for an entire IC describing each cell instance as residing at a separate position within the IC, wherein selection of cell instance positions within the master module is sequentially executed a predefined portion at a time to be biased toward minimizing lengths of nets linking those cell instances to other cell instances, and wherein cell instance placement within each clone module area is collectively established by periodically copying cell placement within each predefined portion of the master module area as it is sequentially executed; and
   c. generating a trial routing plan for the entire IC, defining approximate routes for nets linking cell instances forming the plurality of modules including the master module and the at least one clone module.

2. The method in accordance with claim 1 wherein step (a) comprises substeps of:
   a1. processing the design to identify the master module and the at least one clone module,
   a2. determining a size, shape and position within the layout of the master area and each clone area, and
   a3. generating the floor plan with the master area and each clone area being sized and positioned as determined at step (a2).

3. The method in accordance with claim 1 wherein step (b) comprises substeps of:
   b1. selecting a preliminary position for each clone module cell instances within the corresponding clone module area in a manner that is independent of a position of any cell instance not forming that clone module;
   b2. generating a preliminary trial placement describing all clone module cell instances as residing at the positions selected at step (b1) and describing all other cell instances of the IC as residing at positions determined in a manner biased toward minimizing lengths of nets linked to the clone module cell instances at their selected positions and ensuring that all master module cell instances reside within the master module area; and
   b3. modifying the preliminary trial placement generated at step (b2) to convert cell instance placement within each clone module area to a copy of cell instance placement within the master module area.

4. The method in accordance with claim 3 wherein the preliminary positions for all cell instances of each clone module within the corresponding clone module area is the same.

5. The method in accordance with claim 1 wherein step (b) comprises substeps of:
   b1. selecting a preliminary position for each clone module cell instances within the corresponding clone module area in a manner that is independent of a position of any cell instance not forming that clone module;
   b2. employing a min-cut algorithm to iteratively divide each area of the floor plan other than any clone module area into progressively smaller sub-areas and to allocate cells between the sub-areas after each division in a manner biased toward minimizing a number of nets that will cross sub-area boundaries, and b3. modifying positions of clone module cell instances after each of a plurality of iterations of the min-cut algorithm so that cell instance placement within each clone module area is a copy of a current cell instance placement within the master module area.

6. A method for generating a layout for an integrated circuit (IC) based on an IC design describing the IC as comprising cell instances forming a plurality of modules, including a master module and at least one clone module identical to the master module, the cell instances being linked to one another by nets, the method comprising the steps of:

a. generating a floor plan for the IC, defining positions and dimensions of a plurality of separate areas of the IC, each area corresponding to a separate module of the IC, including a master module area corresponding to the master module, and a separate clone module area corresponding to each clone module, the master module area and each clone module area being identical in size and shape;

b. generating a trial placement plan for an entire IC describing each cell instance as residing at a separate position within the IC, wherein selection of cell instance positions within the master module is biased toward minimizing lengths of nets linking those cell instances to other cell instances, and wherein cell instance placement within each clone module area is established by copying cell placement within the master module area;

c. generating a trial routing plan for the entire IC, defining approximate routes for nets linking cell instances forming the plurality of modules including the master module and the at least one clone module;

d. partitioning the IC design so that the master module and each of the clone modules becomes a separate partition of the IC design;

e. generating a detailed layout for the master module partition, specifying a position for each cell instance forming the master module within the master module area and indicating an exact route of each net within the master module area;

f. copying the detailed layout for the master module to generate a detailed layout for each clone module within its corresponding clone module area; and g. generating a detailed layout for the entire IC, specifying a position for every cell instance forming the IC and an exact route for every net, wherein the detailed layout for the entire IC includes the detailed layouts for the master and clone modules generated at steps (e) and (f).

7. The method in accordance with claim 6 wherein step (a) comprises substeps of:

a1. processing the design to identify the master module and the at least one clone module, a2. determining a size, shape and position within the layout of the master area and each clone area, and a3. generating the floor plan with the master area and each clone area being sized and positioned as determined at step (a2).

8. The method in accordance with claim 6 wherein step (b) comprises substeps of:

b1. selecting a preliminary position for each clone module cell instances within the corresponding clone module area in a manner that is independent of a position of any cell instance not forming that clone module;

b2. generating a preliminary trial placement describing all clone module cell instances as residing at the positions selected at step (b1) and describing all other cell instances of the IC as residing at positions determined in a manner biased toward minimizing lengths of nets linked to the clone module cell instances at their selected positions and ensuring that all master module cell instances reside within the master module area; and b3. modifying the preliminary trial placement generated at step (b2) to convert cell instance placement within each clone module area to a copy of cell instance placement within the master module area.

9. The method in accordance with claim 8 wherein the preliminary positions for all cell instances of each clone module within the corresponding clone module area is the same.

10. The method in accordance with claim 6 wherein step (b) comprises substeps of:

b1. selecting a preliminary position for each clone module cell instances within the corresponding clone module area in a manner that is independent of a position of any cell instance not forming that clone module;

b2. employing a min-cut algorithm to iteratively divide each area of the floor plan other than any clone module area into progressively smaller sub-areas and to allocate cells between the sub-areas after each division in a manner biased toward minimizing a number of nets that will cross sub-area boundaries, and b3. modifying positions of clone module cell instances after each of a plurality of iterations of the min-cut algorithm so that cell instance placement within each clone module area is a copy of a current cell instance placement within the master module area.

11. Computer-readable media storing software, which when read and executed by a computer, causes the computer to carry out a method for generating a layout for an integrated circuit (IC) based on an IC design describing the IC as comprising cell instances forming a plurality of modules, including a master module and at least one clone module identical to the master module, the cell instances being linked to one another by nets, the method comprising the steps of:

a. generating a floor plan for the IC, defining positions and dimensions of a plurality of separate areas of the IC, each area corresponding to a separate module of the IC, including a master module area corresponding to the master module, and a separate clone module area corresponding to each clone module, the master module area and each clone module area being identical in size and shape;

b. generating a trial placement plan for an entire IC describing each cell instance as residing at a separate position within the IC, wherein selection of cell instance positions within the master module is sequentially executed a predefined portion at a time to be biased toward minimizing lengths of nets linking those cell instances to other cell instances, and wherein cell instance placement within each clone module area is collectively established by periodically copying cell placement within each predefined portion of the master module area as it is sequentially executed; and c. generating a trial routing plan for the entire IC, defining approximate routes for nets linking cell instances forming the plurality of modules including the master module and the at least one clone module.

12. The computer-readable media in accordance with claim 11 wherein step (a) comprises substeps of:

a1. processing the design to identify the master module and the at least one clone module, a2. determining a size, shape and position within the layout of the master area and each clone area, and a3. generating the floor plan with the master area and each clone area being sized and positioned as determined at step (a2).

13. The computer-readable media in accordance with claim 11 wherein step (b) comprises substeps of:

b1. selecting a preliminary position for each clone module cell instances within the corresponding clone module area in a manner that is independent of a position of any cell instance not forming that clone module;

b2. generating a preliminary trial placement describing all clone module cell instances as residing at the positions selected at step (b1) and describing all other cell instances of the IC as residing at positions determined in a manner biased toward minimizing lengths of nets linked to the clone module cell instances at their selected positions and ensuring that all master module cell instances reside within the master module area; and b3. modifying the preliminary trial placement generated at step (b2) to convert cell instance placement within each clone module area to a copy of cell instance placement within the master module area.

14. The computer-readable media in accordance with claim 13 wherein the preliminary positions for all cell instances of each clone module within the corresponding clone module area is the same.

15. The computer-readable media in accordance with claim 11 wherein step (b) comprises substeps of:

b1. selecting a preliminary position for each clone module cell instances within the corresponding clone module area in a manner that is independent of a position of any cell instance not forming that clone module;

b2. employing a min-cut algorithm to iteratively divide each area of the floor plan other than any clone module area into progressively smaller sub-areas and to allocate cells between the sub-areas after each division in a manner biased toward minimizing a number of nets that will cross sub-area boundaries, and b3. modifying positions of clone module cell instances after each of a plurality of iterations of the min-cut algorithm so that cell instance placement within each clone module area is a copy of a current cell instance placement within the master module area.

16. Computer-readable media storing software, which when read and executed by a computer, causes the computer to carry out a method for generating a layout for an integrated circuit (IC) based on an IC design describing the IC as comprising cell instances forming a plurality of modules, including a master module and at least one clone module identical to the master module, the cell instances being linked to one another by nets, the method comprising the steps of:

a. generating a floor plan for the IC, defining positions and dimensions of a plurality of separate areas of the IC, each area corresponding to a separate module of the IC, including a master module area corresponding to the master module, and a separate clone module area corresponding to each clone module, the master module area and each clone module area being identical in size and shape;

b. generating a trial placement plan for an entire IC describing each cell instance as residing at a separate position within the IC, wherein selection of cell instance positions within the master module is biased toward minimizing lengths of nets linking those cell instances to other cell instances, and wherein cell instance placement within each clone module area is established by copying cell placement within the master module area;

c. generating a trial routing plan for the entire IC, defining approximate routes for nets linking cell instances forming the plurality of modules including the master module and the at least one clone module;

d. partitioning the IC design so that the master module and each of the clone modules becomes a separate partition of the IC design;

e. generating a detailed layout for the master module partition, specifying a position for each cell instance forming the master module within the master module area and indicating an exact route of each net within the master module area;

f. copying the detailed layout for the master module to generate a detailed layout for each clone module within its corresponding clone module area; and g. generating a detailed layout for the entire IC, specifying a position for every cell instance forming the IC and an exact route for every net, wherein the detailed layout for the entire IC includes the detailed layouts for the master and clone modules generated at steps (e) and (f).

17. The computer-readable media in accordance with claim 16 wherein step (a) comprises substeps of:

a1. processing the design to identify the master module and the at least one clone module, a2. determining a size, shape and position within the layout of the master area and each clone area, and a3. generating the floor plan with the master area and each clone area being sized and positioned as determined at step (a2).

18. The computer-readable media in accordance with claim 16 wherein step (b) comprises substeps of:

b1. selecting a preliminary position for each clone module cell instances within the corresponding clone module area in a manner that is independent of a position of any cell instance not forming that clone module;

b2. generating a preliminary trial placement describing all clone module cell instances as residing at the positions selected at step (b1) and describing all other cell instances of the IC as residing at positions determined in a manner biased toward minimizing lengths of nets linked to the clone module cell instances at their selected positions and ensuring that all master module cell instances reside within the master module area; and b3. modifying the preliminary trial placement generated at step (b2) to convert cell instance placement within each clone module area to a copy of cell instance placement within the master module area.

19. The computer-readable media in accordance with claim 18 wherein the preliminary positions for all cell instances of each clone module within the corresponding clone module area is the same.

20. The computer-readable media in accordance with claim 16 wherein step (b) comprises substeps of:

b1. selecting a preliminary position for each clone module cell instances within the corresponding clone module area in a manner that is independent of a position of any cell instance not forming that clone module;

b2. employing a min-cut algorithm to iteratively divide each area of the floor plan other than any clone module area into progressively smaller sub-areas and to allocate cells between the sub-areas after each division in a manner biased toward minimizing a number of nets that will cross sub-area boundaries, and b3. modifying positions of clone module cell instances after each of a plurality of iterations of the min-cut algorithm so that cell instance placement within each clone module area is a copy of a current cell instance placement within the master module area.

* * * * *